United States Patent
Zhang et al.

(10) Patent No.: US 12,543,514 B2
(45) Date of Patent: Feb. 3, 2026

(54) RESISTIVE RANDOM-ACCESS MEMORY DEVICES WITH METAL-NITRIDE COMPOUND ELECTRODES

(71) Applicant: TetraMem Inc., Fremont, CA (US)

(72) Inventors: Minxian Zhang, Amherst, MA (US); Mingche Wu, Newark, CA (US); Ning Ge, Danville, CA (US)

(73) Assignee: TetraMem Inc., San Jose, CA (US)

( * ) Notice: Subject to any disclaimer, the term of this patent is extended or adjusted under 35 U.S.C. 154(b) by 677 days.

(21) Appl. No.: 17/843,347

(22) Filed: Jun. 17, 2022

(65) Prior Publication Data

US 2022/0367804 A1 Nov. 17, 2022

Related U.S. Application Data

(63) Continuation-in-part of application No. 17/319,057, filed on May 12, 2021, now Pat. No. 12,213,390.

(51) Int. Cl.
*H10N 70/00* (2023.01)
*H10N 70/20* (2023.01)

(52) U.S. Cl.
CPC ......... *H10N 70/841* (2023.02); *H10N 70/011* (2023.02); *H10N 70/24* (2023.02); *H10N 70/8833* (2023.02)

(58) Field of Classification Search
CPC .............. H10N 70/841; H10N 70/8833; H10N 70/826; G11C 2213/52
See application file for complete search history.

(56) References Cited

U.S. PATENT DOCUMENTS

| | | |
|---|---|---|
| 8,658,511 B1 | 2/2014 | Fulgenico et al. |
| 9,691,979 B2 | 6/2017 | Chang et al. |
| 11,527,712 B2 | 12/2022 | Zhang et al. |

(Continued)

FOREIGN PATENT DOCUMENTS

| | | |
|---|---|---|
| CN | 115605073 A | 1/2023 |
| JP | 201279930 A | 4/2012 |

(Continued)

OTHER PUBLICATIONS

Ellingham Diagrams, webpage < https://web.mit.edu/2.813/www/readings/Ellingham_diagrams.pdf >, 1 page, 2013, retrieved from Internet Archive Wayback Machine < https://web.archive.org/web/20130718002056/https://web.mit.edu/2.813/www/readings/Ellingham_diagrams.pdf >.

(Continued)

*Primary Examiner* — Shih Tsun A Chou
(74) *Attorney, Agent, or Firm* — Jaffery Watson Hamilton & DeSanctis LLP

(57) ABSTRACT

The present disclosure relates to resistive random-access memory (RRAM) devices. In some embodiments, an RRAM device includes: a first electrode including a metal nitride; a second electrode comprising a first conductive material; and a switching oxide layer positioned between the first electrode and the second electrode. The switching oxide layer includes at least one transition metal oxide. In some embodiments, the metal nitride in the first electrode includes titanium nitride and/or tantalum nitride. The first electrode does not include a non-reactive metal, such as platinum (Pt), palladium (Pd), etc.

20 Claims, 14 Drawing Sheets

(56) References Cited

U.S. PATENT DOCUMENTS

| | | |
|---|---|---|
| 11,793,095 B2 | 10/2023 | Hsu et al. |
| 2005/0018516 A1 | 1/2005 | Chevallier et al. |
| 2009/0272962 A1 | 11/2009 | Kumar et al. |
| 2010/0243983 A1 | 9/2010 | Chiang et al. |
| 2011/0227028 A1 | 9/2011 | Sekar et al. |
| 2013/0168632 A1* | 7/2013 | Moon .................. H10N 70/041 977/773 |
| 2013/0299763 A1 | 11/2013 | Moon et al. |
| 2014/0091271 A1 | 4/2014 | Tu |
| 2014/0091272 A1 | 4/2014 | Liao et al. |
| 2014/0241038 A1 | 8/2014 | Terai |
| 2014/0252295 A1 | 9/2014 | Liao et al. |
| 2014/0252297 A1 | 9/2014 | Chang et al. |
| 2014/0361864 A1 | 12/2014 | Fukuda et al. |
| 2015/0041751 A1 | 2/2015 | Zhang et al. |
| 2015/0137063 A1 | 5/2015 | Ramaswamy et al. |
| 2015/0137064 A1 | 5/2015 | Kumar et al. |
| 2015/0235698 A1 | 8/2015 | Tsai et al. |
| 2015/0357566 A1 | 12/2015 | Wang et al. |
| 2017/0117467 A1 | 4/2017 | Chang |
| 2017/0346006 A1 | 11/2017 | Nabatame et al. |
| 2018/0062075 A1 | 3/2018 | Jo et al. |
| 2018/0198064 A1* | 7/2018 | Chiang ................ H10N 70/826 |
| 2018/0219154 A1 | 8/2018 | Majhi et al. |
| 2020/0343445 A1 | 10/2020 | Strutt |
| 2021/0013407 A1 | 1/2021 | Xiao et al. |
| 2021/0028230 A1 | 1/2021 | Zhang et al. |
| 2021/0066589 A1 | 3/2021 | Zhang et al. |
| 2022/0006008 A1 | 1/2022 | Zhang et al. |
| 2022/0013720 A1 | 1/2022 | Zhang et al. |
| 2022/0077389 A1 | 3/2022 | Zhang et al. |
| 2022/0140239 A1* | 5/2022 | Su ........................ H10N 70/826 257/4 |
| 2022/0320430 A1 | 10/2022 | Zhang et al. |
| 2022/0367802 A1 | 11/2022 | Zhang et al. |
| 2022/0367803 A1 | 11/2022 | Zhang et al. |

FOREIGN PATENT DOCUMENTS

| | | |
|---|---|---|
| JP | 2014022660 A | 2/2014 |
| JP | 2016015397 A | 1/2016 |
| JP | 2018502218 A | 1/2018 |
| TW | 200824046 A | 6/2008 |
| TW | 201349238 A | 12/2013 |
| TW | 201539729 A | 10/2015 |
| TW | 201633576 A | 9/2016 |
| TW | 202228133 A | 7/2022 |
| WO | 2017019068 A1 | 2/2017 |
| WO | 2018057012 A1 | 3/2018 |
| WO | 2022240426 A1 | 11/2022 |
| WO | 2022241125 A1 | 11/2022 |
| WO | 2022241139 A1 | 11/2022 |

OTHER PUBLICATIONS

International Searching Authority (ISA)/US, International Preliminary Report on Patentability for PCT/US2022/029008, mailed Nov. 23, 2023, 7 pages.
International Searching Authority (ISA)/US, International Preliminary Report on Patentability for PCT/US2022/029029, mailed Nov. 23, 2023, 8 pages.
International Searching Authority (ISA)/US, International Search Report for PCT/US2021/040389, mailed Oct. 13, 2021, 8 pages.
International Searching Authority (ISA)/US, International Search Report for PCT/US2022/029008, mailed Aug. 19, 2022, 8 pages.
International Searching Authority (ISA)/US, International Search Report for PCT/US2022/029029, mailed Aug. 18, 2022, 9 pages.
International Searching Authority (ISA)/US, International Search Report for PCT/US23/68679, mailed Oct. 10, 2023, 2 pages.
International Searching Authority (ISA)/US, International Search Report for PCT/US23/68681, mailed Oct. 10, 2023, 2 pages.
International Searching Authority (ISA)/US, Written Opinion for PCT/US23/68679, mailed Oct. 10, 2023, 7 pages.
International Searching Authority (ISA)/US, Written Opinion for PCT/US23/68681, mailed Oct. 10, 2023, 4 pages.

* cited by examiner

RESISTIVE RANDOM-ACCESS MEMORY DEVICES WITH METAL-NITRIDE COMPOUND ELECTRODES

CROSS-REFERENCE TO RELATED APPLICATIONS

The present application is a continuation-in-part of U.S. patent application Ser. No. 17/319,057, entitled "Resistive Random-Access Memory Devices with Multi-Component Electrodes," filed on May 12, 2021, which is incorporated by reference in its entirety.

TECHNICAL FIELD

The implementations of the disclosure relate generally to resistive random-access memory (RRAM) devices and, more specifically, to RRAM devices with metal-nitride compound electrodes.

BACKGROUND

A resistive random-access memory (RRAM) device is a two-terminal passive device with tunable and non-volatile resistance. The resistance of the RRAM device may be electrically switched between a high-resistance state (HRS) and a low-resistance state (LRS) by applying suitable programming signals to the RRAM device. RRAM devices may be used to form crossbar arrays that may be used to implement in-memory computing applications, non-volatile solid-state memory, image processing applications, neural networks, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, a resistive random-access memory (RRAM) device may include: a first electrode including a metal nitride; a second electrode comprising a conductive material; and a switching oxide layer positioned between the first electrode and the second electrode. The switching oxide layer includes at least one transition metal oxide. The first electrode does not include a non-reactive metal, such as platinum (Pt), palladium (Pd), etc.

According to one or more aspects of the present disclosure, methods for fabricating an RRAM device are provided. The methods include fabricating one or more layers on a first electrode including a metal nitride; and fabricating a second electrode on a top layer of the one or more layers. The second electrode includes a conductive material. The one or more layers include a switching oxide layer positioned between the first electrode and the second electrode. The switching oxide layer includes at least one transition metal oxide.

In some embodiments, the metal nitride in the first electrode includes titanium nitride.

In some embodiments, the metal nitride in the first electrode includes tantalum nitride.

In some embodiments, the at least one transition metal oxide includes at least one of $HfO_x$ or $TaO_y$, wherein $x \leq 2.0$, and wherein $y \leq 2.5$.

In some embodiments, the conductive material in the second electrode includes tantalum.

In some embodiments, the RRAM device further includes an interface layer A positioned between the switching oxide layer and the second electrode.

In some embodiments, the interface layer A includes aluminum oxide.

In some embodiments, the RRAM device further includes an interface layer B positioned between the switching oxide layer and the first electrode.

In some embodiments, the interface layer A or the interface layer B includes aluminum oxide.

In some embodiments, the interface layer A and the interface layer B both include aluminum oxide.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

DETAILED DESCRIPTION

Figure 1:
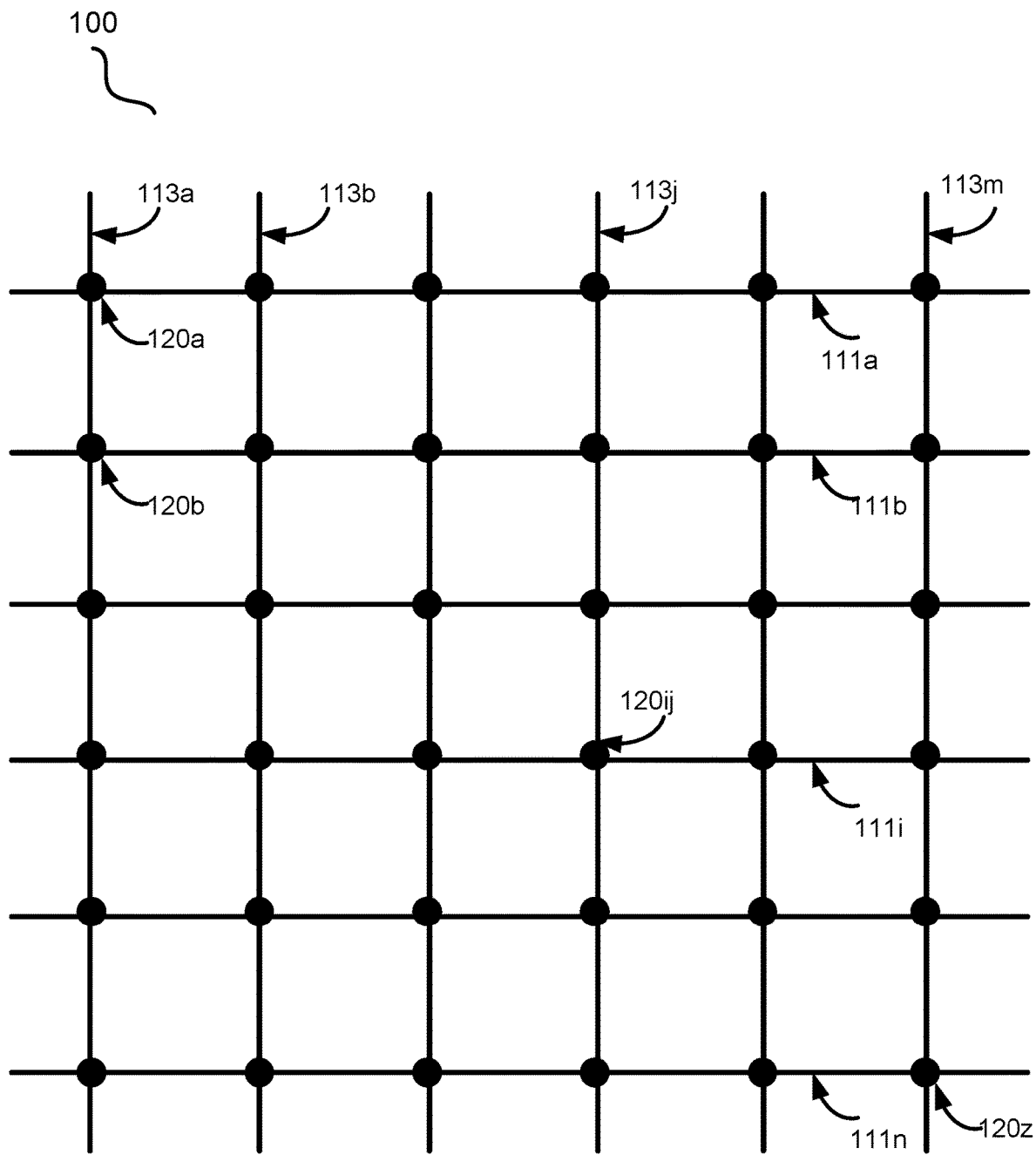
FIG. 1 is a schematic diagram illustrating an example of a crossbar circuit in accordance with some implementations of the disclosure.

Aspects of the disclosure provide resistive random-access memory (RRAM) devices and methods for fabricating the RRAM devices. An RRAM device is a two-terminal passive device with tunable resistance. The RRAM device may include a first electrode, a second electrode, and a switching oxide layer positioned between the first electrode and the second electrode. In some embodiments, the first electrode and the second electrode may be a bottom electrode and a top electrode of the RRAM device, respectively. In some embodiments, the first electrode and the second electrode may be a top electrode and a bottom electrode of the RRAM device, respectively. The first electrode may include a non-reactive metal, such as platinum (Pt), palladium (Pd), etc. The second electrode may include a reactive metal, such as tantalum (Ta). The electrode including the non-reactive metal is also referred to herein as the "non-reactive electrode." The electrode including the reactive metal is also referred to herein as the "reactive electrode." The switching oxide layer may include a transition metal oxide, such as hafnium oxide ($HfO_x$) or tantalum oxide ($TaO_x$). The RRAM device may be in an initial state or virgin state and may have an initial high resistance before it is subject to a suitable electrical stimulation (e.g., a voltage or current signal applied to the RRAM device). The RRAM device may be tuned to a lower resistance state from the virgin state via a forming process or from a high-resistance state (HRS) to a lower resistance state (LRS) via a setting process. The forming process may refer to programming a device starting from the virgin state. The setting process may refer to programming a device starting from the high resistance state (HRS). After the reactive metal electrode is deposited on the switching oxide, the reactive metal can absorb oxygen from the switching oxide layer and create oxygen vacancies in the switching oxide layer, and oxygen ions can migrate in the switching oxide through a vacancy mechanism. During a forming process, a suitable programming signal (e.g., a voltage or current signal) may be applied to the RRAM device, which may cause a drift of oxygen ions to migrate from the switching oxide to the reactive electrode. As a result, a conductive channel or filament may form through the switching oxide layer (e.g., from the reactive electrode to the non-reactive electrode). The RRAM device may then be reset to a high-resistance state by applying a reset signal (e.g., a voltage signal, a current signal) to the RRAM device. The application of the reset signal to the RRAM device may cause oxygen to migrate back to the switching oxide layer and may thus interrupt the conductive filament. The RRAM device may be electrically switched between a high-resistance state and a low-resistance state by applying suitable programming signals (e.g., voltage signals, current signals, etc.) to the RRAM device. In a crossbar array circuit, the programming signals may be provided to the designated RRAM device via a selector, such as a transistor.

An RRAM device with platinum (Pt) in its non-reactive electrode may provide RRAM high performance such as reliability, endurance, multi-levels, retention, etc. In an RRAM including a bottom electrode of Pt, a switching oxide layer including $TaO_x$, and a top electrode including Ta (also referred to as a "Pt/$TaO_x$/Ta system"), a Ta filament in the $TaO_x$ showed excellent behaviors such as linearity, analog, retention, and endurance for in-memory computing (IMC) applications. In a Pt/$HfO_x$/Ta system, Ta can migrate into the $HfO_x$ to form a Ta-rich filament in the $HfO_x$, and showed excellent behaviors such as linearity, analog, retention, and endurance for IMC applications. However, platinum's material and processing costs may be high, and major fabrication plants may not be ready yet to incorporate platinum in their processes. It might be desirable to replace Pt in the non-reactive electrode of an RRAM device with a suitable replacement material that has the chemical stability that it will not react with oxygen during RRAM switching and enables RRAM devices to have multi-level or analog behavior for IMC applications.

In this present disclosure, some embodiments use metal nitrides, e.g., TiN or TaN, as a replacement material for Pt in the non-reactive electrode of an RRAM device. The first electrode does not include a non-reactive metal, such as platinum (Pt), palladium (Pd). Both TiN and TaN are electrically conductive materials. Both TiN and TaN are compatible with CMOS (complementary metal-oxide semiconductor) processes, ready for volume production, and have much lower production costs than Pt. Both TiN and TaN have the chemical stability that they will not react with oxygen during RRAM switching. For IMC applications, RRAM devices with TiN or TaN in their non-reactive electrodes have multi-level or analog behavior.

In some embodiments, an RRAM device may include a device stack of TiN/$HfO_x$/Ta for a first electrode, a switching oxide layer, and a second electrode, respectively. In another implementation, an RRAM device may include a device stack of TiN/$HfO_x$/$AlO_x$/Ta for a first electrode, a switching oxide layer, an interface layer, and a second electrode, respectively. With an interface layer including aluminum oxide, the RRAM device may be a high-resistance and annealing-resistance RRAM device. In a further implementation, an RRAM device may include a device stack of TiN/$AlO_x$/$HfO_x$/$AlO_x$/Ta for a first electrode, a first interface layer, a switching oxide layer, a second interface layer, and a second electrode, respectively.

Compared with RRAM devices using Pt-based non-reactive electrodes, RRAM devices using non-reactive electrodes based on TiN or TaN have lower material and processing costs, are ready for CMOS processes, and are ready for volume production. The RRAM devices disclosed herein present suitable performance and abilities on multiple-switching and analog behavior.

FIG. 1 is a schematic diagram illustrating an example 100 of a crossbar circuit in accordance some embodiments of the present disclosure. As shown, crossbar circuit 100 may include a plurality of interconnecting electrically conductive wires, such as one or more row wires 111a, 111b, . . . , 111i, . . . , 111n, and column wires 113a, 113b, . . . , 113j, . . . , 113m for an n-row by m-column crossbar array. The crossbar circuit 100 may further include cross-point devices 120a, 120b, . . . , 120z, etc. Each of the cross-point devices may connect a row wire and a column wire. For example, the cross-point device 120ij may connect the row wire 111i and the column wire 113j. In some embodiments, crossbar circuit 100 may further include digital to analog converters (DAC, not shown), analog to digital converters (ADC, not shown), switches (not shown), and/or any other suitable circuit components for implementing a crossbar-based apparatus. The number of the column wires 113a-m and the number of the row wires 111a-n may or may not be the same.

Row wires 111 may include a first row wire 111a, a second row wire 111b, . . . , 111i, . . . , and an n-th row wire 111n. Each of row wires 111a, . . . , 111n may be and/or include any suitable electrically conductive material. In some embodiments, each row wire 111a-n may be a metal wire.

Column wires 113 may include a first column wire 113a, a second column wire 113b, . . . , and an m-th column wire 113m. Each of column wires 113a-m may be and/or include any suitable electrically conductive material. In some embodiments, each column wire 113a-m may be a metal wire.

Each cross-point device 120 may be and/or include any suitable device with tunable resistance, such as a memristor, PCM (phase change memory) devices, floating gates, spintronic devices, resistive random-access memory (RRAM), static random-access memory (SRAM), etc. In some embodiments, one or more of cross-point devices 120 may include an RRAM device as described in connection with FIGS. 3A-12.

Crossbar circuit 100 may perform parallel weighted voltage multiplication and current summation. For example, an input voltage signal may be applied to one or more rows of crossbar circuit 100 (e.g., one or more selected rows). The input signal may flow through the cross-point devices of the rows of the crossbar circuit 100. The conductance of the cross-point device may be tuned to a specific value (also referred to as a "weight"). By Ohm's law, the input voltage multiplies the cross-point conductance and generates a current from the cross-point device. By Kirchhoff's law, the summation of the current passing the devices on each column generates the current as the output signal, which may be read from the columns (e.g., outputs of the ADCs). According to Ohm's law and Kirchhoff's current law, the input-output relationship of the crossbar array can be represented as I=VG, wherein I represents the output signal matrix as current; V represents the input signal matrix as voltage; and G represents the conductance matrix of the cross-point devices. As such, the input signal is weighted at each of the cross-point devices by its conductance according to Ohm's law. The weighted current is outputted via each column wire and may be accumulated according to Kirchhoff's current law. This may enable in-memory computing (IMC) via parallel multiplications and summations performed in the crossbar arrays.

Figure 2:
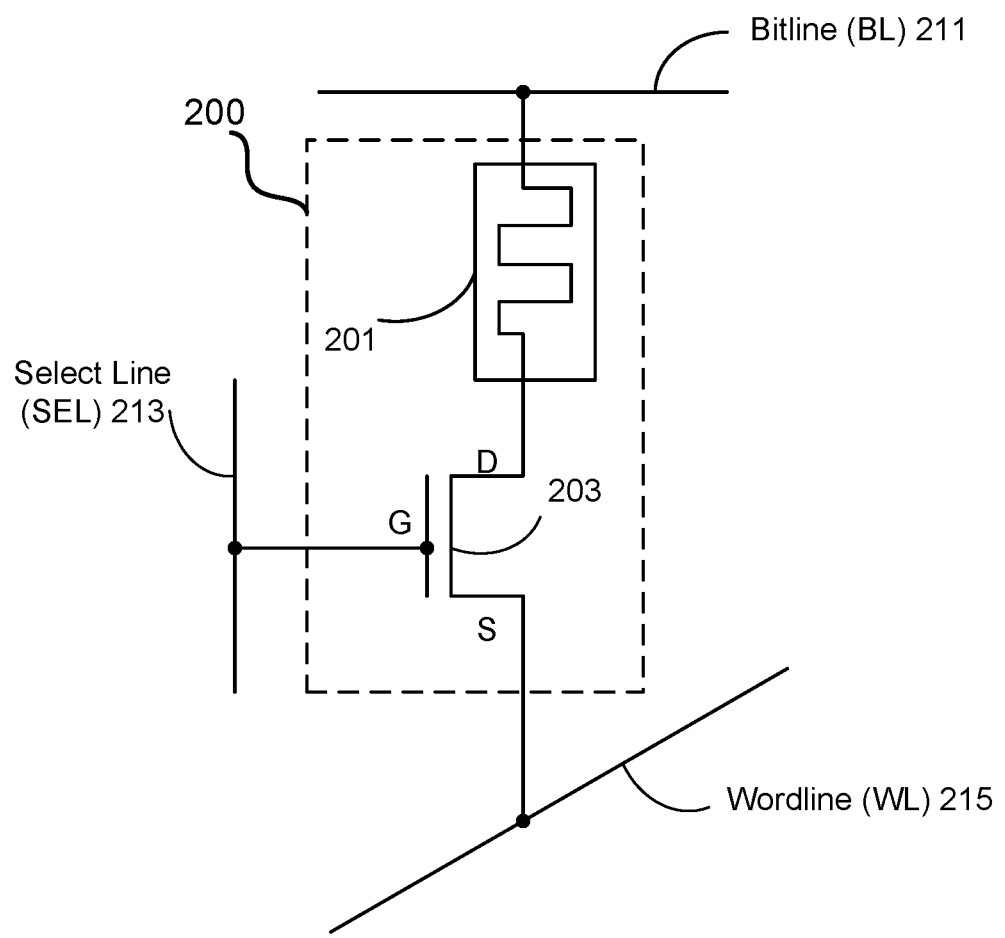
FIG. 2 is a schematic diagram illustrating an example of a cross-point device in accordance with some implementations of the disclosure.

FIG. 2 is a schematic diagram illustrating an example 200 of a cross-point device in accordance some embodiments of the present disclosure. As shown, cross-point device 200 may connect a bitline (BL) 211, a select line (SEL) 213, and a wordline (WL) 215. The bitline 211 and the wordline 215 may be a column wire and a row wire as described in connection with FIG. 1, respectively.

Cross-point device 200 may include an RRAM device 201 and a transistor 203. A transistor is a three-terminal device, which may be marked as gate (G), source (S), and drain (D), respectively. The transistor 203 may be serially connected to RRAM device 201. As shown in FIG. 2, the first electrode of the RRAM device 201 may be connected to the drain of transistor 203. The second electrode of the RRAM device 201 may be connected to the bitline 211. The source of the transistor 203 may be connected to the wordline 215. The gate of the transistor 203 may be connected to the select line 213. RRAM device 201 may include one or more RRAM devices as described in connection with FIGS. 3A-11 below. Cross-point device 200 may also be referred to as a one-transistor-one-resistor (1T1R) configuration. The transistor 203 may perform as a selector as well as a current controller, which may set the current compliance, to the RRAM device 201 during programming. The gate voltage on transistor 203 can set current compliances to cross-point device 200 during programming and can thus control the conductance and analog behavior of cross-point device 200. For example, when cross-point device 200 is set from a high-resistance state to a low-resistance state, a set signal (e.g., a voltage signal, a current signal) may be provided via the bitline (BL) 211. Another voltage, also referred as a select voltage or gate voltage, may be applied via the select line (SEL) 213 to the transistor gate to open the gate and set the current compliance, while the wordline (WL) 215 may be set to ground. When cross-point device 200 is reset from the low-resistance state to the high-resistance state, a gate voltage may be applied to the gate of the transistor 203 via the select line 213 to open the transistor gate. Meanwhile, a reset signal may be sent to the RRAM device 201 via the wordline 215, while the bitline 211 may be set to ground.

Figure 3A:
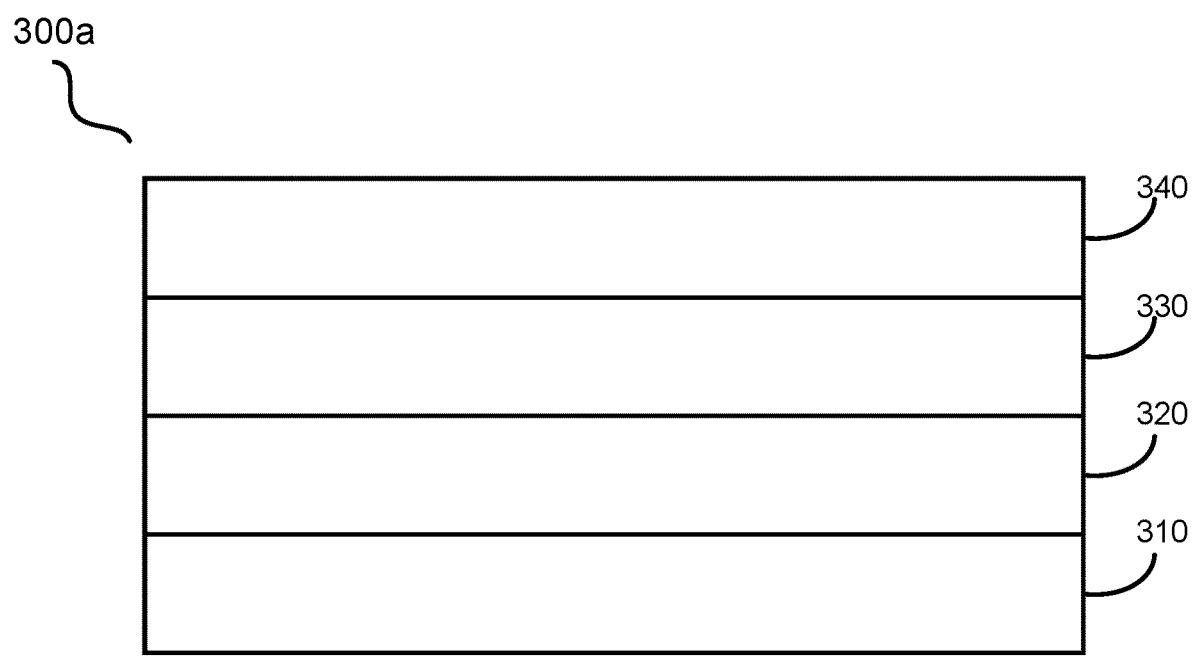
FIG. 3A illustrates a cross-sectional view of a first example RRAM device that uses a metal nitride instead of platinum (Pt) in its non-reactive electrode.
Figure 3B:
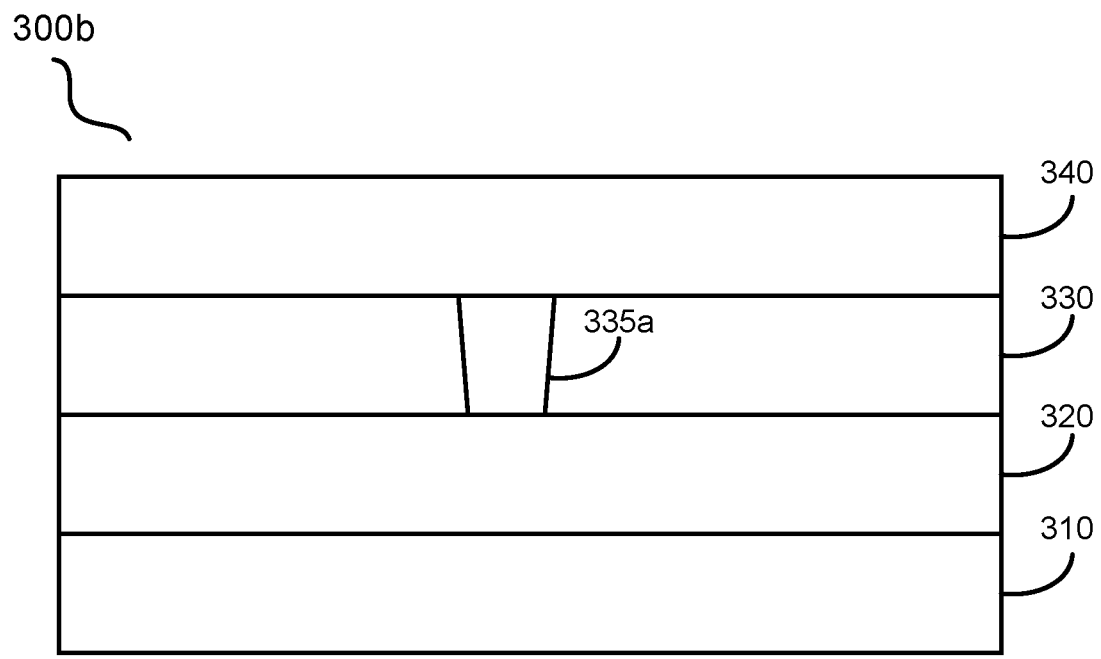
FIGS. 3B and 3C illustrate cross-sectional views of the RRAM device of FIG. 3A in a low-resistance state and a high-resistance state, respectively.
Figure 3C:
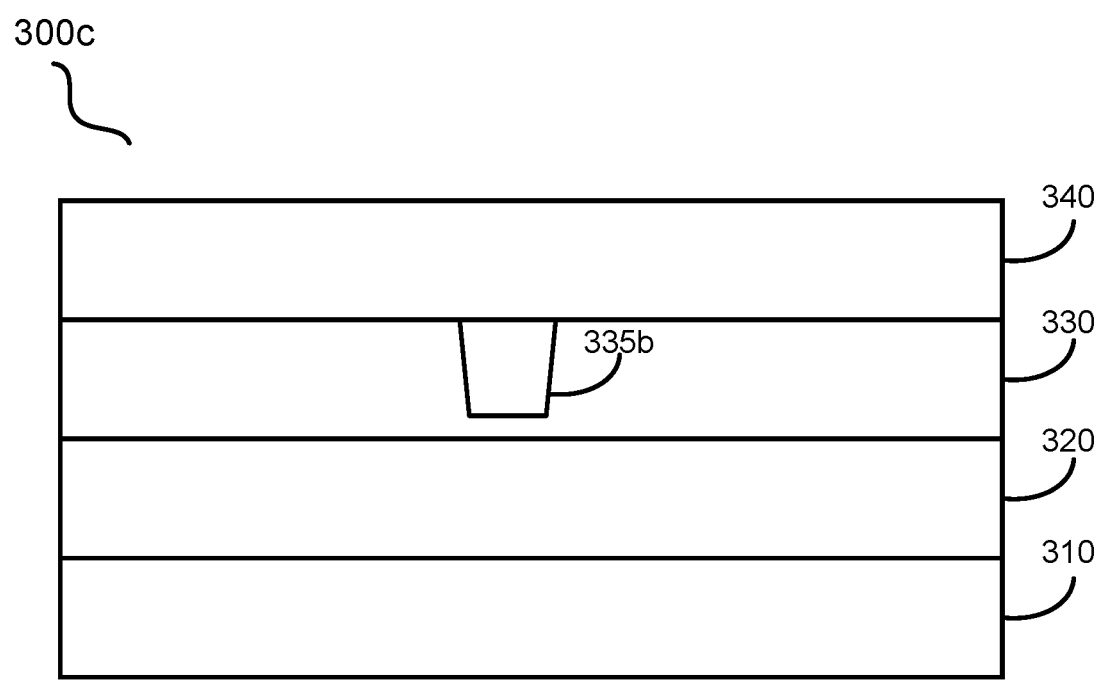

FIGS. 3A, 3B, and 3C illustrate cross-sectional views of example RRAM devices in accordance with some embodiments of the present disclosure. RRAM devices 300b, and 300c may correspond to a low-resistance state and a high-resistance state of RRAM device 300a, respectively.

As shown in FIG. 3A, RRAM device 300a may include a substrate 310, a first electrode 320 fabricated on substrate 310, a switching oxide layer 330, and a second electrode 340. Switching oxide layer 330 is fabricated between first electrode 320 and second electrode 340. Substrate 310 may include one or more layers of any suitable material that may serve as a substrate for an RRAM device, such as silicon (Si), silicon dioxide ($SiO_2$), silicon nitride ($Si_3N_4$), aluminum oxide ($Al_2O_3$), aluminum nitride (AlN), etc. In some embodiments, substrate 310 may include diodes, transistors, interconnects, integrated circuits, etc. In some embodiments, the substrate may include a driving circuit including one or more electrical circuits (e.g., an array of electrical circuits) that may be individually controllable. In some embodiments, the driving circuit may include one or more complementary metal-oxide-semiconductor (CMOS) drivers.

First electrode 320 may include a metal nitride that is electronically conductive and non-reactive to the switching oxide. The metal nitride may have a suitable chemical stability that it will not react with oxygen during RRAM switching. For example, first electrode 320 may include titanium nitride (TiN), tantalum nitride (TaN), etc. First electrode 320 does not include a non-reactive metal, such as platinum (Pt), palladium (Pd), etc. First electrode 320 does not include Pt or Pd in some embodiments. RRAM devices with the metal nitride in their non-reactive electrodes have multi-level or analog behavior desirable for IMC applications.

In some embodiments, a layer of Ta and/or Ti may (not shown) may be fabricated between first electrode and substrate 310 to enhance adhesion between substrate 310 and the components of the RRAM device 300a.

Switching oxide layer 330 may include one or more transition metal oxides, such as $TaO_x$, $HfO_x$, $TiO_x$, $NbO_x$, $ZrO_x$, etc., in binary oxides, ternary oxides, and high order oxides. In some embodiments, the chemical stability of the non-reactive material in first electrode 320 may be higher than that of the transition metal oxide(s) in switching oxide layer 330. In some embodiments, the transition metal oxide(s) include at least one of $HfO_x$ or $TaO_x$, wherein x may be used to indicate the oxide being oxygen deficient compared to its full (or terminal) oxide and the value of x may be varied from the oxygen to metal atomic ratio in the stoichiometry of its full oxide, such as $x \leq 2.0$ for $HfO_x$ (where $HfO_2$ being the full oxide), and $x \leq 2.5$ for $TaO_x$ (where $Ta_2O_5$ being the full oxide).

The thermochemical stability between the first electrode (including TiN) and the switching oxide layer (including $HfO_x$) can be evaluated, e.g., through chemical reaction (1) below:

$$HfO_2 + TiN = TiO_2 + HfN \qquad (1)$$

$$\Delta H° = \Delta H°_{TiO2} + \Delta H°_{HfN} - \Delta H°_{HfO2} - \Delta H°_{TiN} = 32.4 \text{ kcal} > 0$$

$\Delta S° = S°_{TiO_2} + S°_{HfN} - S°_{HfO_2} - S°_{TiN} = 0.04$ cal/deg~0

$\Delta G° = \Delta H° - T \Delta S° = 32400 - 0.04T > 0$ $\Delta H°$, $\Delta S°$, $\Delta G°$ are the enthalpy change, entropy change, and the free energy change of the reaction (1) at 298K (or 25° C.), respectively.

$\Delta H° >> 0$ and $\Delta G° >> 0$ suggest that chemical reaction (1) is not thermodynamically favored, or $HfO_2$ and TiN will not spontaneously react to form $TiO_2$ and HfN when $HfO_2$ and TiN are in contact.

For the thermochemical stability evaluations, below is a reference table based on *Metallurgical Thermochemistry, 5th Edition* by O. Kubaschewski and C. B. Alcock.

| Substance | $\Delta H°_{298}$ k cal/mole | $S°_{298}$ cal/deg mole |
|---|---|---|
| $HfO_2$ | −266.0 | 14.2 |
| TiN | −80.4 | 7.24 |
| $TiO_2$ | −225.8 | 12.03 |
| HfN | −88.2 | 9.45 |

Second electrode 340 may include any suitable metallic material that are electronically conductive and reactive to the switching oxide. For example, the metallic material in second electrode 340 may include Ta, Hf, Ti, TiN, TaN, etc. Second electrode 340 may be reactive to the switching oxide and may have suitable oxygen solubility to adsorb some oxygen from the switching oxide layer 330 and create oxygen vacancies in the switching oxide layer 330. In other words, the reactive metallic material(s) in second electrode 340 may have suitable oxygen solubility and/or oxygen mobility. In some embodiments, second electrode 340 not only may be able to create oxygen vacancies in switching oxide layer 330 (e.g., by scavenging oxygen), but also may function as oxygen reservoir or source to the switching oxide layer 330 during cell programming.

RRAM device 300a may have an initial resistance (also referred to herein as the "virgin resistance") after it is fabricated. The initial resistance of RRAM device 300a may be changed and RRAM device 300a may be switched to a state of a lower resistance via a forming process. For example, a suitable voltage or current may be applied to RRAM device 300a. The application of the voltage to RRAM device 300a may induce the metallic material(s) in the second electrode to absorb oxygen from the switching oxide layer 330 and create oxygen vacancies in the switching oxide layer 330. As a result, a conductive channel (e.g., a filament) which is oxygen vacancy rich may form in the switching oxide layer 330. For example, as illustrated in FIG. 3B, a conductive channel 335a may be formed in the switching oxide layer 330. As shown, conductive channel 335a may be formed from the second electrode 340 to the first electrode 320 across the switching oxide layer 330. RRAM device 300b may be reset to a high-resistance state. For example, a reset signal (e.g., a voltage signal or a current signal) may be applied to RRAM device 300b during a reset process. In some embodiments, the set signal and the reset signal may have opposite polarity, i.e., a positive signal and a negative signal, respectively. The application of the reset signal may cause oxygen to drift back to the switching oxide layer 330 and recombine with one or more of the oxygen vacancies. For example, an interrupted conductive channel 335b as shown in FIG. 3C may be formed in the switching oxide layer 330 during the reset process. As shown, the conductive channel may be interrupted with an oxide gap between the interrupted conductive channel 335b and the first electrode 320. The lateral dimension of the interrupted conductive channel 335b may be smaller than that of the conductive channel 335a. In some embodiments, the interrupted conductive channel 335b does not continuously connect the first electrode 320 and the second electrode 340. RRAM device 300a-c may be electrically switched between the high-resistance state and the low-resistance state by applying suitable programming signals (e.g., voltage signals, current signals, etc.) to the RRAM device.

In one implementation, second electrode 340 may include one or more alloys. Each of the alloys may contain two or more metallic elements. Each of the alloys may include a binary alloy (e.g., an alloy containing two metallic elements), a ternary alloy (e.g., an alloy containing three metallic elements), a quaternary alloy (e.g., an alloy containing four metallic elements), a quinary alloy (e.g., an alloy containing five metallic elements), a senary alloy (e.g., an alloy containing six metallic elements), and/or a high order alloy (e.g., an alloy containing more than six metallic elements). In some embodiments, the second electrode 340 may include one or more alloys containing a first metallic element and one or more second metallic elements. Each of the second metallic elements may be less or more reactive to the transition metal oxide in the switching oxide layer than the first metallic element. In some embodiments, the first metallic element may be Ta. The second metallic elements may include one or more of tungsten (W), hafnium (Hf), molybdenum (Mo), niobium (Nb), zirconium (Zr), etc. In some embodiments, the ratio of the first metallic element to the second metallic element(s) in an alloy in the second electrode 340 may be about 50 atomic percent. In some embodiments, the suitable ratio of the first metallic element to the second metallic element in the alloy may be optimized from the entire composition range. During a forming process, the second metallic element(s) may create fewer oxygen vacancies in the switching oxide layer than the first metallic element. As such, the lateral size of the filament formed in an RRAM device comprising a second electrode containing the alloy may be smaller than that of the filament formed in an RRAM device comprising a second electrode made of only the first metal.

In some implementations, second electrode 340 may include multiple layers of different metallic materials. For example, second electrode 340 may include a layer of titanium (Ti) and a layer of tantalum (Ta). The layer of Ti may be much thinner than the layer of Ta. For example, a thickness of the layer of Ti may be between about 0.2 nm and 5 nm. A thickness of the layer of Ta may be about 50 nm. In some embodiments, the thickness of the layer of Ti may be between 0.3 nm and 2 nm. Both Ti and Ta may trap and release oxygen during device operations. The incorporation of the thin Ti layer into the RRAM device may change the virgin resistance of the RRAM device, result in a less abrupt forming process, reduce the forming voltage, reduce the reset current, and reduce voltage and/or current requirements in subsequent operation processes.

In some embodiments, RRAM device 300a may include a device stack of $TiN/HfO_x/Ta$ for first electrode 320, switching oxide layer 330, and second electrode 340, respectively.

Figure 4:
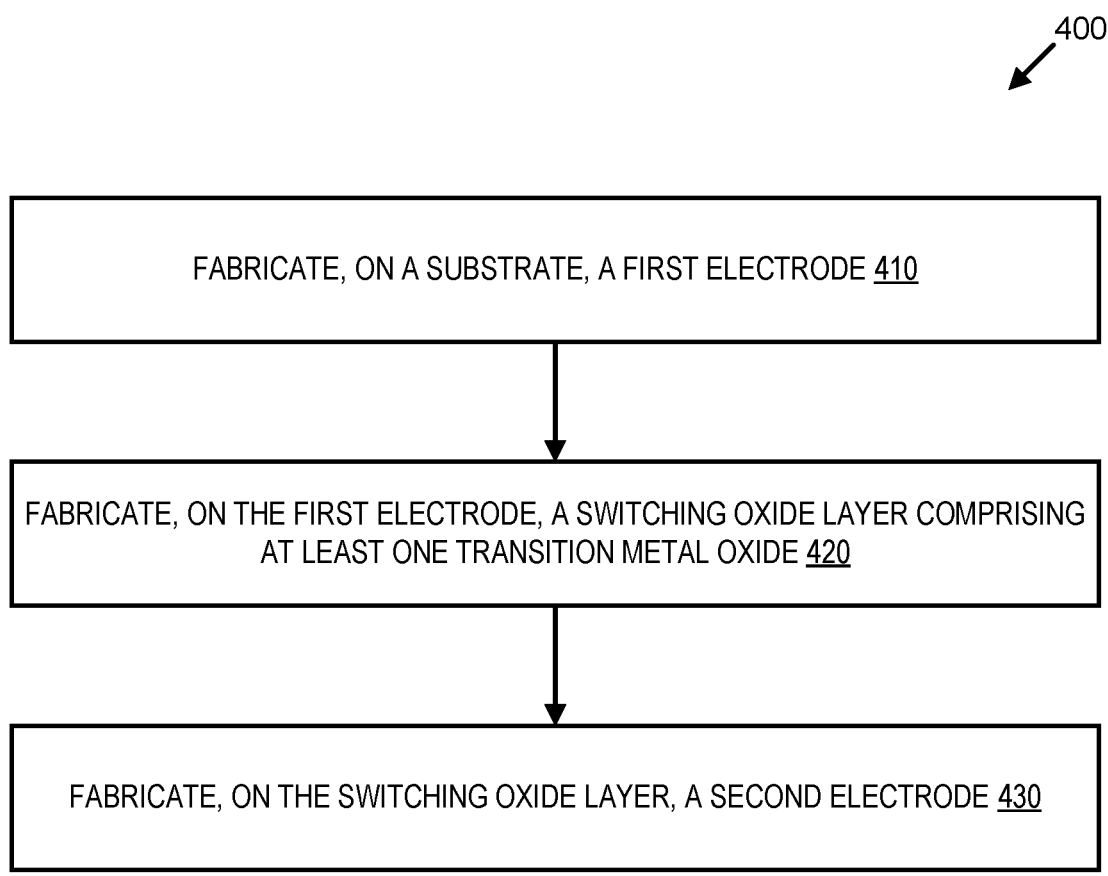
FIG. 4 is a flow diagram illustrating a method for fabricating an RRAM device according to some embodiments of the disclosure.

FIG. 4 is a flow diagram illustrating an example 400 of a method for fabricating an RRAM device according to some embodiments of the disclosure, including a no-Pt RRAM device 300a-300c in FIGS. 3A-3C.

At block 410, a first electrode may be fabricated on a substrate. Fabricating the first electrode may involve depositing one or more layers of a metal nitride, such as TiN or TaN. For example, fabricating the first electrode may involve depositing one or more layers of TiN, utilizing an atomic layer deposition (ALD) technique, a physical vapor deposition (PVD) technique, a reactive sputtering of Ti technique, and/or any other suitable deposition technique. The first electrode may be and/or include first electrode 320 as described in connection with FIG. 3A above. In some embodiments, a thin layer of an adhesion material, such as Ti, Ta, etc., may be fabricated between the substrate and the first electrode.

At block 420, a switching oxide layer comprising one or more transition metal oxides may be fabricated on the first electrode. The transition metal oxides may include, e.g., $HfO_x$. For example, fabricating the switching oxide layer may involve depositing $HfO_x$, utilizing an atomic layer deposition (ALD) technique, a physical vapor deposition (PVD) technique, a reactive sputtering of Hf technique, and/or any other suitable deposition technique. The switching oxide layer may be and/or include switching oxide layer 330 as described in connection with FIG. 3A above.

At block 430, a second electrode may be fabricated on the switching oxide layer. Fabricating the second electrode may involve fabricating one or more layers of one or more metallic materials that are electronically conductive and reactive to the switching oxide. For example, fabricating the second electrode may involve depositing one or more layers of Ta, utilizing a physical vapor deposition (PVD) technique, and/or any other suitable deposition technique. The second electrode may be and/or include second electrode 340 as described in connection with FIG. 3A above.

Figure 5A:
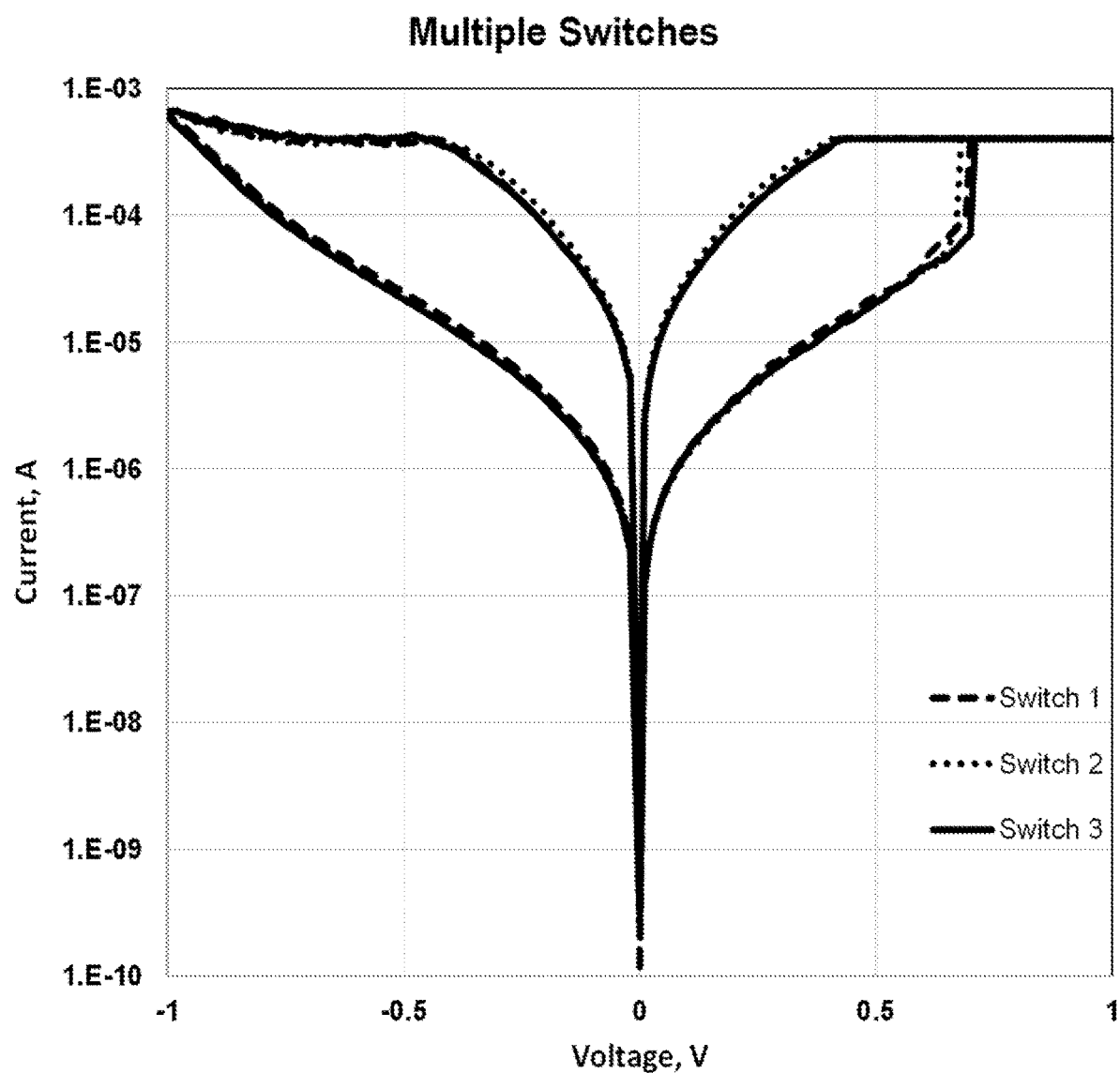
FIG. 5A shows I-V (current-voltage) characteristics of an RRAM device in accordance with some embodiments of the present disclosure.

FIG. 5A illustrates I-V (current-voltage) characteristics of RRAM device 300a using a device stack of $TiN/HfO_x/Ta$ in accordance with some embodiments of the present disclosure. RRAM device 300a presents repeatable and desirable set-reset operations for Switch 1, Switch 2, and Switch 3 in FIG. 5A, demonstrating stabilities for multiple switches.

Figure 5B:
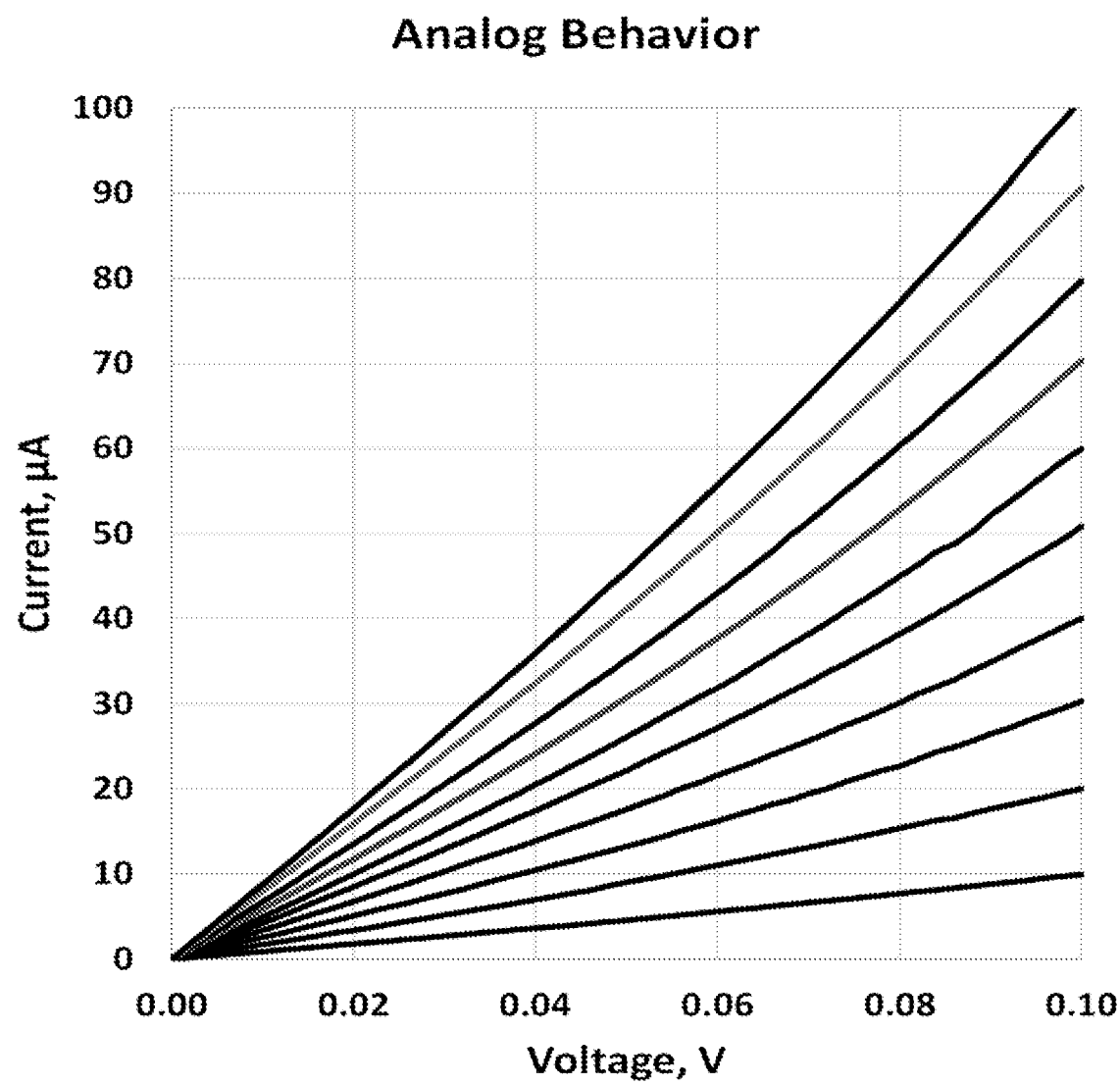
FIG. 5B is an I-V curve showing the analog behavior of an RRAM device in accordance with some embodiments of the present disclosure.

FIG. 5B is an I-V curve showing the analog behavior of the RRAM device 300a using a device stack of $TiN/HfO_x/Ta$ in accordance with some embodiments of the present disclosure. RRAM device 300a presents desirable analog behavior, that the device resistance can be tuned to multi-levels (or analog behavior) by controlling the current compliance, and the current is linearly proportional to the voltage (or linearity behavior) at each resistance state.

Figure 6A:
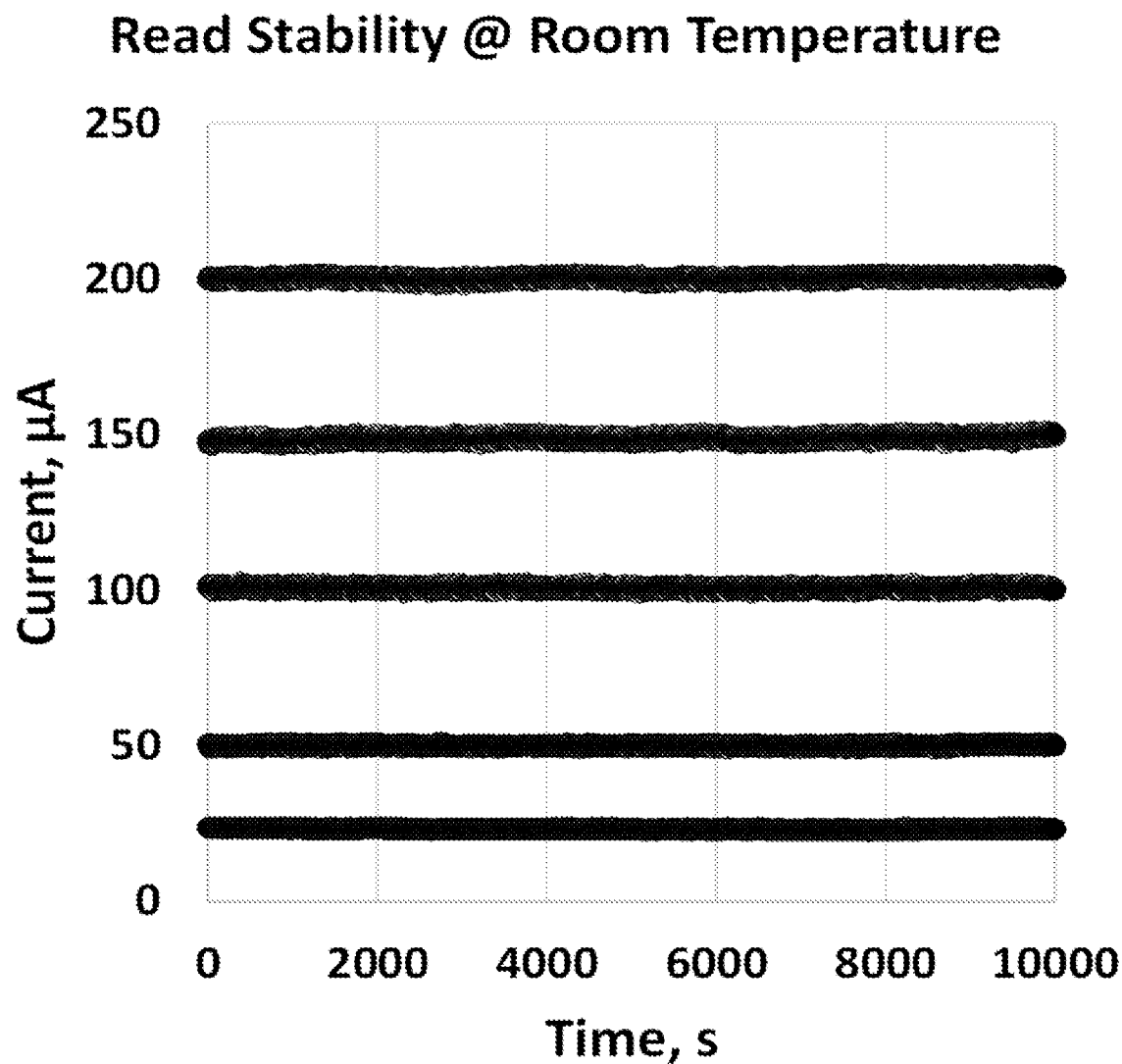
FIGS. 6A and 6B illustrate read stability of an example RRAM device with time at room temperature and 135° C., respectively, in accordance with some embodiments of the present disclosure.
Figure 6B:
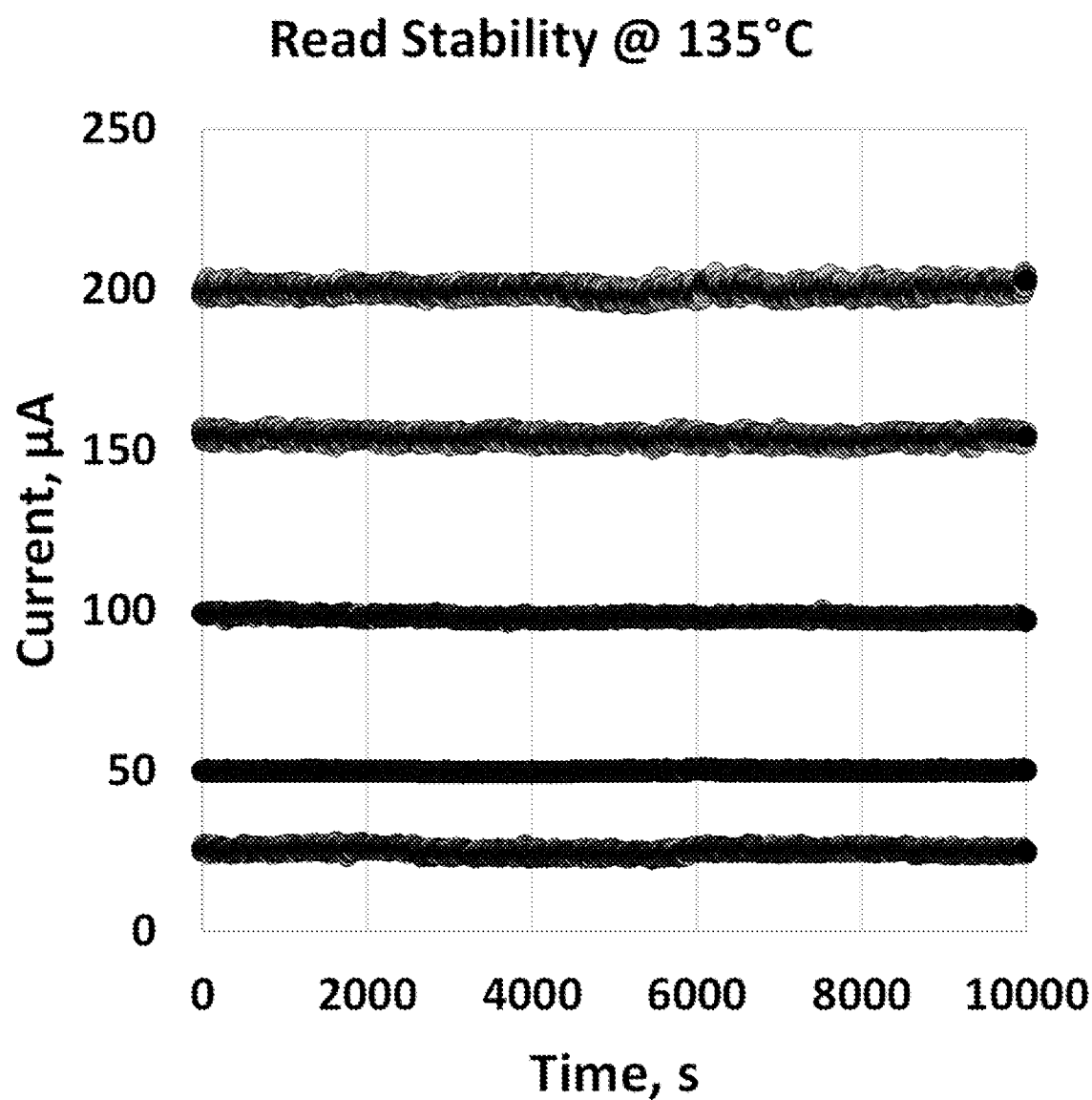

FIGS. 6A and 6B are diagrams 600a and 600b illustrating device read current characteristics of an example RRAM device over time in accordance with some embodiments of the present disclosure. The example RRAM device may include a device stack of $TiN/HfO_x/Ta$. Diagrams 600a and 600b illustrate the device read current characteristics of the example RRAM device at room temperature and 135° C., respectively. Diagrams 600a and 600b may represent results of a device retention test for the RRAM device's capabilities to retain the resistance levels with time. Diagrams 600a and 600b may also represent results of a read stability test as the RRAM device is under constant reading (with a reading voltage of 0.2V) for its capabilities to retain the resistance levels with time. As shown in FIG. 6A, the RRAM device exhibit desirable device read stability over time at room temperature. As shown in FIG. 6B, the RRAM device exhibit desirable read stability over time at 135° C. As such, the RRAM device presents desirable resistance stabilities or retentions at device operation temperatures.

Figure 7:
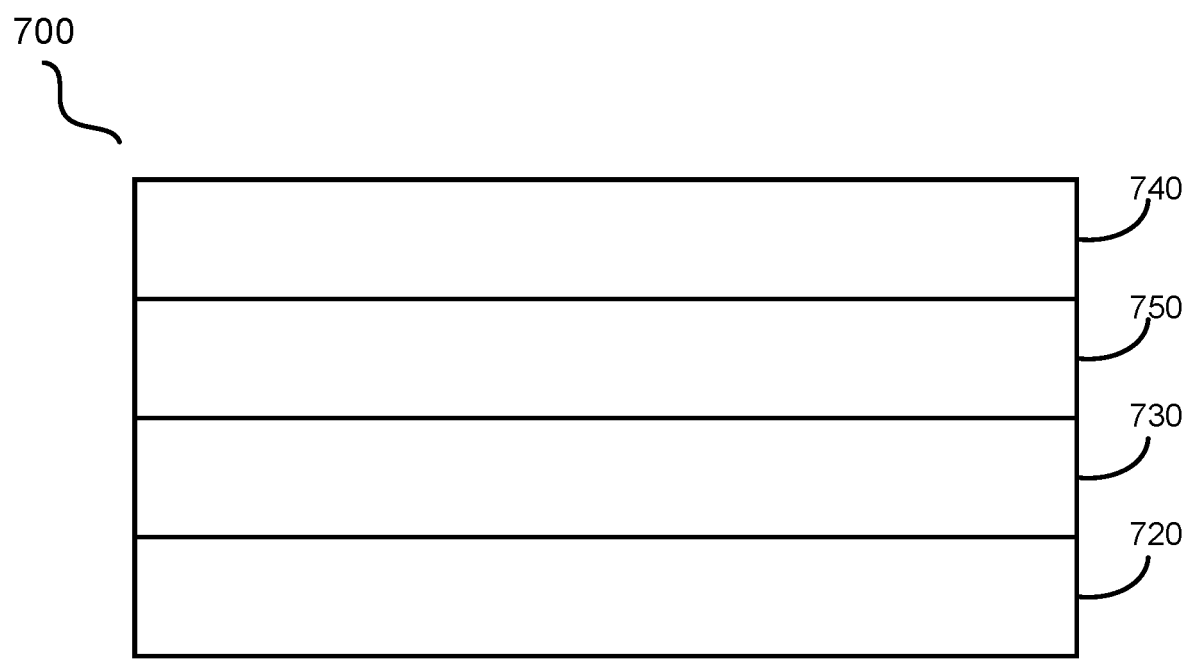
FIG. 7 illustrates a cross-sectional view of a second example RRAM device that uses a metal nitride instead of platinum (Pt) in its non-reactive electrode.

FIG. 7 illustrates a cross-sectional view of an example RRAM device 700 that uses a metal nitride instead of platinum (Pt) in its non-reactive electrode in accordance with another implementation of the present disclosure. RRAM 700 may be referred to as a no-Pt RRAM device.

RRAM device 700 may include a first electrode 720, a switching oxide layer 730, an interface layer A (ILA) 750, and a second electrode 740. First electrode 720, switching oxide layer 730, and second electrode 740 may be the same as first electrode 320, switching oxide layer 330, and second electrode 340 as described in connection with FIG. 3A, respectively. In some embodiments, RRAM device 700 may further include a substrate (not shown) as described in connection with FIG. 3A.

ILA 750 (also referred to as the "first interface layer") may include a first material that is more chemically stable than the transition metal oxide. The first material may include, for example, $Al_2O_3$, MgO, $Y_2O_3$, $La_2O_3$, etc. ILA 750 may include a discontinuous film of the first material and/or a continuous film of the first material. In some embodiments, a thickness of ILA 750 may be between about 0.2 nm and about 0.5 nm. In some embodiments, the ILA 750 may include an $Al_2O_3$ film having a thickness equal to or less than 0.5 nm. In some embodiments, the ILA 750 may be and/or include an $Al_2O_3$ film having a thickness less than 1 nm.

In some embodiments, RRAM device 700 may include a device stack of $TiN/HfO_x/AlO_x/Ta$ for first electrode 720, switching oxide layer 730, ILA 750, and second electrode 740, respectively. With ILA 750 including aluminum oxide, RRAM device 700 may be a high-resistance and annealing-resistant RRAM device.

Figure 8:
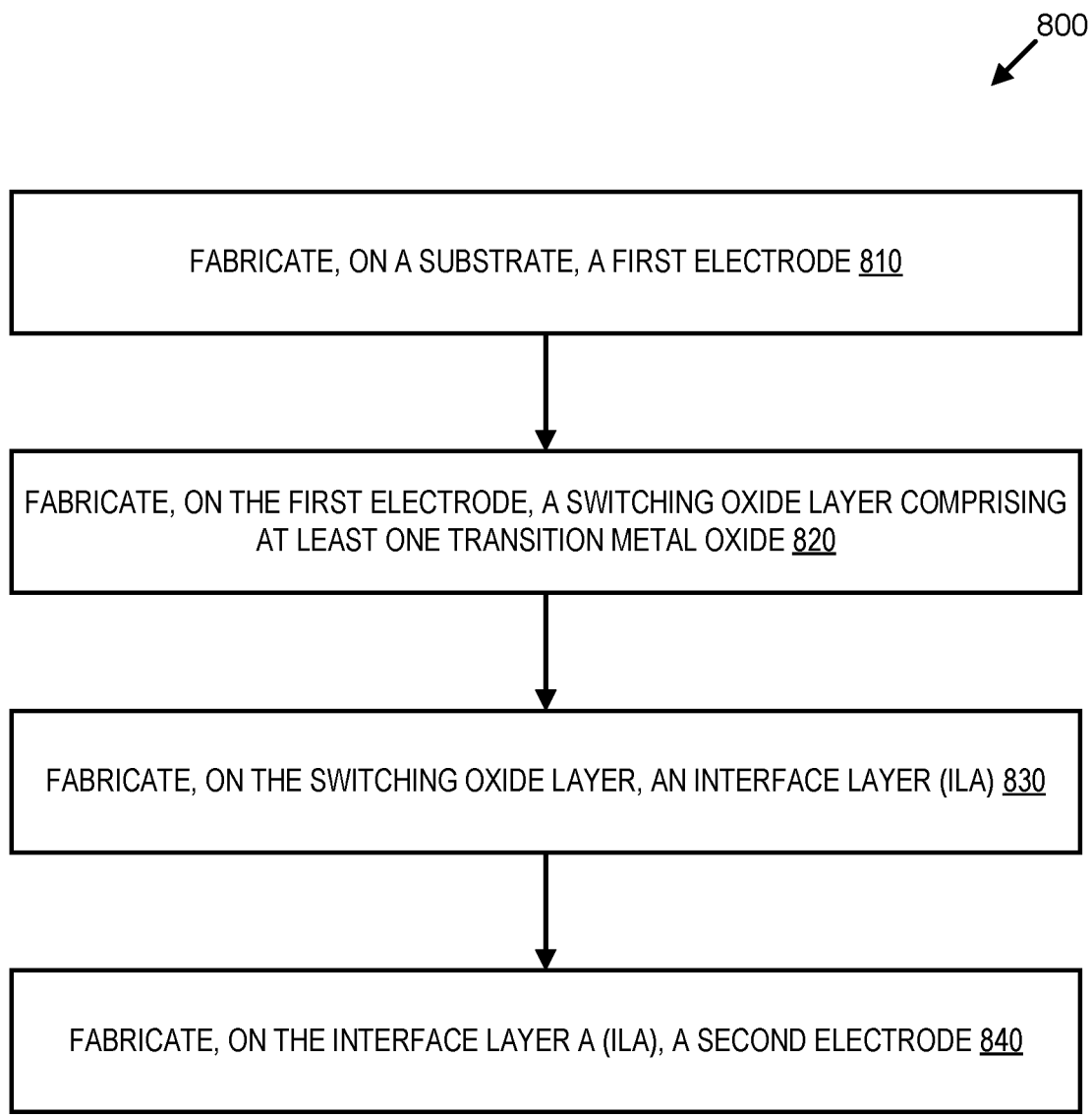
FIG. 8 is a flow diagram illustrating a method for fabricating an RRAM device according to some embodiments of the disclosure.

FIG. 8 is a flow diagram illustrating an example 800 of a method for fabricating an RRAM device according to some embodiments of the disclosure, including RRAM device 700 in FIG. 7.

At block 810, a first electrode may be fabricated on a substrate. Fabricating the first electrode may involve depositing one or more layers of a metal nitride, such as TiN or TaN. For example, fabricating the first electrode may involve depositing one or more layers of TiN, utilizing an atomic layer deposition (ALD) technique, a physical vapor deposition (PVD) technique, a reactive sputtering of Ti technique, and/or any other suitable deposition technique. The first electrode may be and/or include first electrode 720 as described in connection with FIG. 7 above.

At block 820, a switching oxide layer comprising one or more transition metal oxides may be fabricated on the first electrode. The transition metal oxides may include, e.g., $HfO_x$. For example, fabricating the switching oxide layer may involve depositing $HfO_x$, utilizing an atomic layer deposition (ALD) technique, a physical vapor deposition (PVD) technique, a reactive sputtering of Hf technique, and/or any other suitable deposition technique. The switching oxide layer may be and/or include switching oxide layer 730 as described in connection with FIG. 7 above.

At block 830, an interface layer may be fabricated on the switching oxide layer. The first interface layer may include a material that is more chemically stable than the transition metal oxide(s) of the switching oxide layer, such as $AlO_x$, like $Al_2O_3$. For example, fabricating the first interface layer may involve depositing $AlO_x$, utilizing an atomic layer deposition (ALD) technique, a physical vapor deposition (PVD) technique, a reactive sputtering of Al technique, and/or any other suitable deposition technique. The interface layer A may be and/or include ILA 750 as described in connection with FIG. 7 above.

At block 840, a second electrode may be fabricated on the interface layer. Fabricating the second electrode may involve fabricating one or more layers of one or more metallic materials that are electronically conductive and reactive to the switching oxide. For example, fabricating the second electrode may involve depositing one or more layers of Ta, utilizing a physical vapor deposition (PVD) technique, and/or any other suitable deposition technique. The second electrode may be and/or include second electrode 740 as described in connection with FIG. 7 above.

Figure 9:
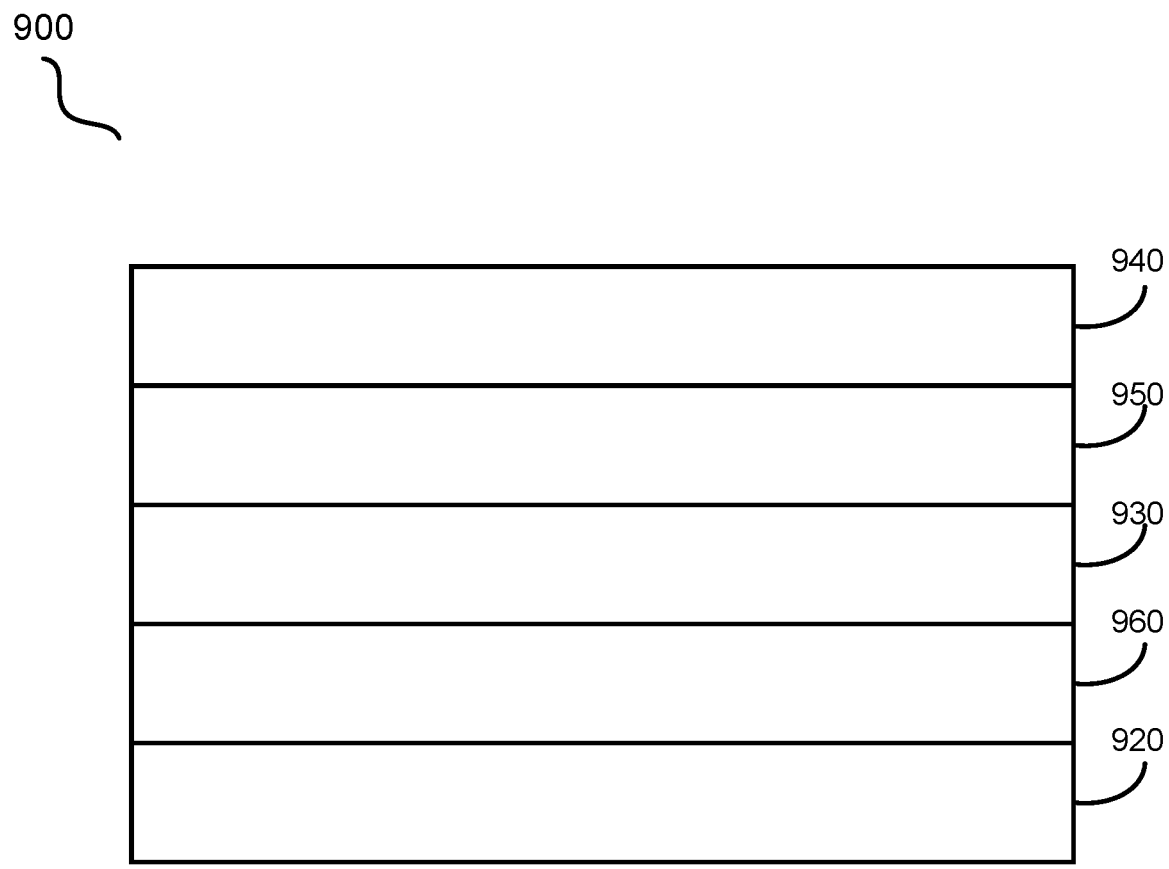
FIG. 9 illustrates a cross-sectional view of a third example RRAM device that uses a metal nitride instead of platinum (Pt) in its non-reactive electrode.

FIG. 9 illustrates a cross-sectional view of an example RRAM device 900 that uses a metal nitride instead of platinum (Pt) in its non-reactive electrode in accordance with a further implementation of the present disclosure. RRAM device 900 may be referred to as a no-Pt RRAM. RRAM device 900 may include a first electrode 920, an interface layer B (ILB) 960, a switching oxide layer 930, an interface layer A (ILA) 950, and a second electrode 940. First electrode 920, switching oxide layer 930, and second electrode 940 may be the same as first electrode 320, switching oxide layer 330, and second electrode 340 as described in connection with FIG. 3A, respectively. ILA 950 may be the same as ILA 750 of FIG. 7. In some embodiments, RRAM device 900 may further include a substrate (not shown) as described in connection with FIG. 3A.

ILB 960 may include a second material that is more chemically stable than the transition metal oxide. The second material may include, for example, $Al_2O_3$, MgO, $Y_2O_3$, $La_2O_3$, etc. ILB 960 may include a discontinuous film of the second material and/or a continuous film of the second material. In some embodiments, a thickness of ILB 960 may be between about 0.2 nm and about 0.5 nm. In some embodiments, ILB 960 may include an $Al_2O_3$ film having a thickness equal to or less than 0.5 nm. In some embodiments, ILB 960 may be and/or include an $Al_2O_3$ film having a thickness less than 1 nm.

RRAM device 900 may use a device stack of TiN/$AlO_x$/$HfO_x$/$AlO_x$/Ta for first electrode 920, ILB 960, switching oxide layer 930, ILA 950, and second electrode 940, respectively. With the first interface layer and the second interface layer, RRAM device 900 may be a high-resistance and annealing-resistance RRAM device.

Figure 10:
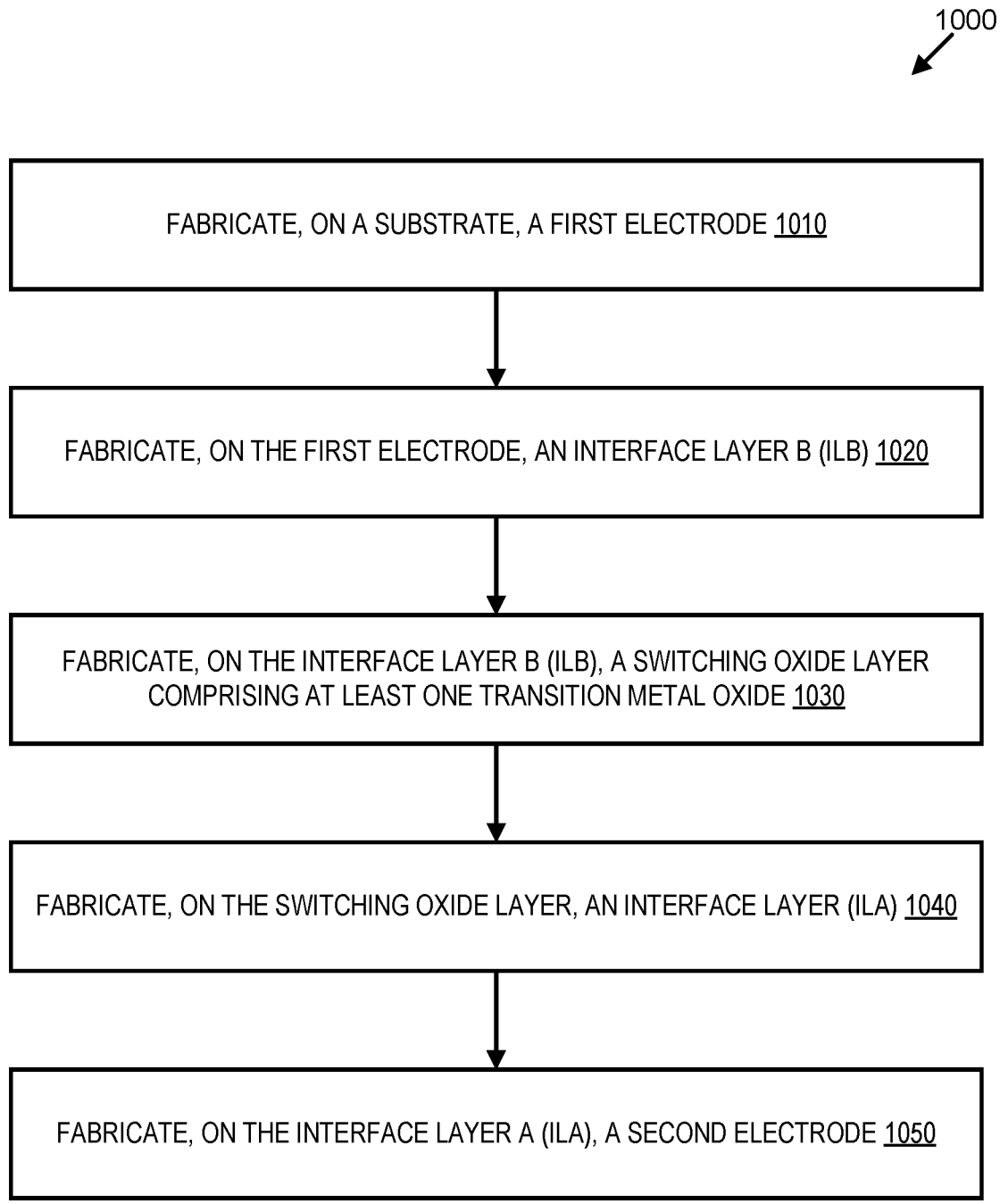
FIGS. 10 and 11 are flow diagrams illustrating methods for fabricating an RRAM device according to some embodiments of the disclosure.

FIG. 10 is a flow diagram illustrating an example 1000 of a method for fabricating an RRAM device according to some embodiments of the disclosure, including RRAM device 900 in FIG. 9.

At block 1010, a first electrode may be fabricated on a substrate. Fabricating the first electrode may involve depositing one or more layers of a metal nitride, such as TiN or TaN. For example, fabricating the first electrode may involve depositing one or more layers of TiN, utilizing an atomic layer deposition (ALD) technique, a physical vapor deposition (PVD) technique, a reactive sputtering of Ti technique, and/or any other suitable deposition technique. The first electrode may be and/or include first electrode 920 as described in connection with FIG. 9 above.

At block 1020, an interface layer B (ILB) may be fabricated on the first electrode. The ILB may include a material that is more chemically stable than the transition metal oxide(s) of the switching oxide layer (such as $AlO_x$, like $Al_2O_3$) described subsequently. For example, fabricating the interface layer B may involve depositing $AlO_x$, utilizing an atomic layer deposition (ALD) technique, a physical vapor deposition (PVD) technique, a reactive sputtering of Al technique, and/or any other suitable deposition technique. The interface layer B may be and/or include ILB 960 as described in connection with FIG. 9 above.

At block 1030, a switching oxide layer comprising one or more transition metal oxides may be fabricated on the interface layer B. The transition metal oxides may include, e.g., $HfO_x$. For example, fabricating the switching oxide layer may involve depositing $HfO_x$, utilizing an atomic layer deposition (ALD) technique, a physical vapor deposition (PVD) technique, a reactive sputtering of Hf technique, and/or any other suitable deposition technique. The switching oxide layer may be and/or include switching oxide layer 930 as described in connection with FIG. 9 above.

At block 1040, an interface layer A (ILA) may be fabricated on the switching oxide layer. The ILA may include a material that is more chemically stable than the transition metal oxide(s) of the switching oxide layer, such as $AlO_x$, like $Al_2O_3$. For example, fabricating the interface layer A may involve depositing $AlO_x$, utilizing an atomic layer deposition (ALD) technique, a physical vapor deposition (PVD) technique, a reactive sputtering of Al technique, and/or any other suitable deposition technique. The interface layer A may be and/or include ILA 950 as described in connection with FIG. 9 above.

At block 1050, a second electrode may be fabricated on the interface layer A. Fabricating the second electrode may involve fabricating one or more layers of one or more metallic materials that are electronically conductive and reactive to the switching oxide. For example, fabricating the second electrode may involve depositing one or more layers of Ta, utilizing a physical vapor deposition (PVD) technique, and/or any other suitable deposition technique. The second electrode may be and/or include second electrode 940 as described in connection with FIG. 9 above.

Figure 11:
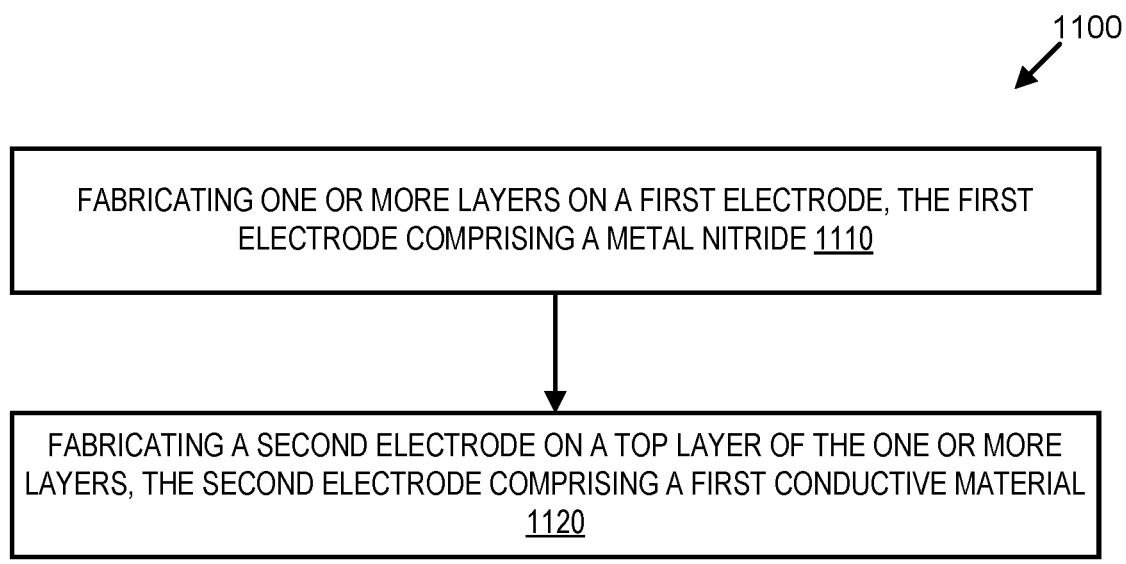

FIG. 11 is a flow diagram illustrating an example 1100 of a method for fabricating an RRAM device according to some embodiments of the disclosure, including RRAM device 300a in FIG. 3A, RRAM device 700 of FIG. 7, and/or RRAM 900 in FIG. 9.

At block 1110, one or more layers may be fabricated on a first electrode. The first electrode includes a metal nitride, such as titanium nitride, tantalum nitride, etc. The one or more layers may include a switching oxide layer positioned between the first electrode and a second electrode of the RRAM device. The switching oxide layer comprises at least one transition metal oxide (e.g., $HfO_x$ and/or $TaO_y$, wherein $x \leq 2.0$, and wherein $y \leq 2.5$.

In some embodiments, the one or more layers on the first electrode may further include one or more interface layers, such as an interface layer A positioned between the switching oxide layer and the second electrode and/or an interface layer B positioned between the switching oxide layer and the first electrode. Each of the interface layer A and the interface layer B may include $Al_2O_3$, MgO, $Y_2O_3$, $La_2O_3$, etc. In some embodiments, at least one of the interface layer A and the interface layer B includes $Al_2O_3$.

At block 1120, a second electrode may be fabricated on a top layer of the one or more layers. The second electrode may include a conductive material. In some embodiments, the conductive material includes Ta, such as one or more alloys of Ta, a layer of Ta, etc. In some embodiments, the second electrode includes a layer of Ta and a layer of Ti.

In some embodiments, the top layer of the one or more layers may be the interface layer A positioned between the switching oxide layer and the second electrode. In some embodiments, the top layer of the one or more layers may be the switching oxide layer.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A resistive random-access memory (RRAM) device, comprising:
   a first electrode comprising a metal nitride;
   a second electrode comprising a conductive material;
   a switching oxide layer positioned between the first electrode and the second electrode, wherein the switching oxide layer comprises at least one transition metal oxide, wherein the conductive material in the second electrode is reactive to the transition metal oxide;
   an interface layer A positioned between the switching oxide layer and the second electrode; and
   an interface layer B positioned between the switching oxide layer and the first electrode, wherein the first electrode does not react with oxygen during the RRAM device's operation.

2. The RRAM device of claim 1, wherein the metal nitride in the first electrode comprises at least one of titanium nitride or tantalum nitride.

3. The RRAM device of claim 2 wherein the first electrode does not comprise a non-reactive metal.

4. The RRAM device of claim 3, wherein the conductive material in the second electrode comprises tantalum.

5. The RRAM device of claim 3, wherein the first electrode does not include platinum (Pt) or palladium (Pd).

6. The RRAM device of claim 1, wherein the at least one transition metal oxide comprises at least one of $HfO_x$ or $TaO_y$, wherein $x \leq 2.0$, and wherein $y \leq 2.5$.

7. The RRAM device of claim 1, wherein the interface layer A comprises aluminum oxide.

8. The RRAM device of claim 1, wherein the interface layer A or the interface layer B comprises aluminum oxide.

9. The RRAM device of claim 1, wherein the interface layer A and the interface layer B both comprise aluminum oxide.

10. The RRAM device of claim 1, further comprising a substrate and a layer of an adhesion material fabricated between the substrate and the first electrode.

11. A method for fabricating a resistive random-access memory (RRAM) device, the method comprising:
    fabricating an interface layer B on a first electrode, the first electrode comprising a metal nitride;
    fabricating, on the interface layer B, a switching oxide layer comprising at least one transition metal oxide;
    fabricating an interface layer A on the switching oxide layer; and
    fabricating, on the interface layer A, a second electrode comprising a conductive material that is reactive to the transition metal oxide.

12. The method of claim 11, wherein the metal nitride in the first electrode comprises titanium nitride.

13. The method of claim 11, wherein the metal nitride in the first electrode comprises tantalum nitride.

14. The method of claim 11, wherein the at least one transition metal oxide comprises at least one of $HfO_x$ or $TaO_y$, wherein $x \leq 2.0$, and wherein $y \leq 2.5$.

15. The method of claim 11, wherein the conductive material in the second electrode comprises tantalum.

16. The method of claim 11, wherein the interface layer A comprises aluminum oxide.

17. The method of claim 11, wherein the interface layer A or the interface layer B comprises aluminum oxide.

18. The method of claim 11, wherein the interface layer A and the interface layer B both comprise aluminum oxide.

19. The method of claim 11, wherein the first electrode does not comprise a non-reactive metal.

20. The method of claim 19, wherein the first electrode does not include platinum (Pt) or palladium (Pd).

* * * * *